United States Patent
Yang et al.

(10) Patent No.: US 10,401,691 B2
(45) Date of Patent: Sep. 3, 2019

(54) DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ming Yang, Beijing (CN); Xi Chen, Beijing (CN); Xue Dong, Beijing (CN); Wenqing Zhao, Beijing (CN); Renwei Guo, Beijing (CN); Hailin Xue, Beijing (CN); Rui Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 63 days.

(21) Appl. No.: 15/039,122

(22) PCT Filed: Sep. 21, 2015

(86) PCT No.: PCT/CN2015/090120
§ 371 (c)(1),
(2) Date: May 25, 2016

(87) PCT Pub. No.: WO2016/123988
PCT Pub. Date: Aug. 11, 2016

(65) Prior Publication Data
US 2017/0160602 A1    Jun. 8, 2017

(30) Foreign Application Priority Data
Feb. 6, 2015 (CN) .......................... 2015 1 0065195

(51) Int. Cl.
*G02F 1/1343* (2006.01)
*G02F 1/1362* (2006.01)
(Continued)

(52) U.S. Cl.
CPC .... *G02F 1/134336* (2013.01); *G02F 1/13439* (2013.01); *G02F 1/134309* (2013.01);
(Continued)

(58) Field of Classification Search
None
See application file for complete search history.

(56) References Cited

U.S. PATENT DOCUMENTS 4,834,507 A * 5/1989 Kato .................. G02F 1/133514
257/59
5,150,240 A * 9/1992 Kim ....................... G02F 1/1368
349/109
(Continued)

FOREIGN PATENT DOCUMENTS

CN    1376014 A    10/2002
CN    1437179 A    8/2003
(Continued)

OTHER PUBLICATIONS

Chinese Office Action in Chinese Application No. 201510065195.2, dated Dec. 29, 2016 with English translation.
(Continued)

*Primary Examiner* — James A Dudek
(74) *Attorney, Agent, or Firm* — Collard & Roe, P.C.

(57) ABSTRACT

A display panel and a display device are provided. The display panel includes a plurality of gate lines, a plurality of data lines and a plurality of sub-pixels (11) formed by the plurality of gate lines and the plurality of data lines intersecting with each other, and the plurality of sub-pixels (11) forming an array. In the array formed by the plurality of
(Continued)

sub-pixels (11), a ratio of a width in a row direction to a height in a column direction of each sub-pixel (11) is greater than 1:3, and a first row of sub-pixels and a second row of sub-pixels are alternately arranged in the column direction. Each sub-pixel (11) in the first row of sub-pixels and its adjacent sub-pixel in the second row of sub-pixels have different colors. Each sub-pixel (11) in the second row of sub-pixels and its adjacent sub-pixel in the first row of sub-pixels have different colors. The sub-pixel (11) in the second row of sub-pixels and the sub-pixel (11) in the first row of sub-pixels which are provided in a same column are staggered by a distance of d in the row direction, where $0 \leq d < W/2$, and W is the width in the row direction of each sub-pixel. In the case that a display resolution is guaranteed, the number of the data lines are reduced, and requirements on the production technology are lowered; besides, the data lines are relatively smooth, and resistance of the data lines is reduced, and voltage load on the display panel is reduced.

17 Claims, 7 Drawing Sheets

(51) Int. Cl.
H01L 27/32 (2006.01)
G02F 1/1337 (2006.01)

(52) U.S. Cl.
CPC .... *G02F 1/136286* (2013.01); *H01L 27/3218* (2013.01); *H01L 27/3279* (2013.01); *G02F 1/133707* (2013.01); *G02F 2001/134318* (2013.01); *G02F 2001/134345* (2013.01); *G02F 2201/121* (2013.01); *G02F 2201/123* (2013.01); *G02F 2201/52* (2013.01)

(56) References Cited

U.S. PATENT DOCUMENTS

| | | | |
|---|---|---|---|
| 5,311,337 A | 5/1994 | McCartney, Jr. | |
| 6,768,482 B2 | 7/2004 | Asano et al. | |
| 6,914,649 B2 | 7/2005 | Liu | |
| 7,388,630 B2 | 6/2008 | Shin et al. | |
| 7,663,299 B2 | 2/2010 | Chao et al. | |
| 7,701,476 B2 | 4/2010 | Brown Elliott et al. | |
| 7,796,226 B2 | 9/2010 | Yamada et al. | |
| 9,164,285 B2 | 10/2015 | Whangbo et al. | |
| 9,721,531 B2* | 8/2017 | Guo | G09G 5/02 |
| 2002/0070909 A1* | 6/2002 | Asano | G09G 3/3233 345/76 |
| 2004/0201811 A1* | 10/2004 | Jun | G02F 1/133753 349/146 |
| 2004/0263748 A1 | 12/2004 | Park et al. | |
| 2005/0012872 A1* | 1/2005 | Baek | G02F 1/136213 349/38 |
| 2005/0083246 A1* | 4/2005 | Saishu | H04N 13/0404 345/1.1 |
| 2005/0122294 A1 | 6/2005 | Ben-David et al. | |
| 2005/0140893 A1* | 6/2005 | Hong | G02F 1/134336 349/139 |
| 2009/0002262 A1 | 1/2009 | Fukushima et al. | |
| 2009/0115946 A1* | 5/2009 | Yamada | G02F 1/134336 349/99 |
| 2011/0043533 A1 | 2/2011 | Han et al. | |
| 2011/0043553 A1 | 2/2011 | Brown Elliott et al. | |
| 2012/0300148 A1* | 11/2012 | Hong | G09G 3/364 349/43 |
| 2015/0014662 A1 | 1/2015 | Huang et al. | |
| 2015/0029208 A1 | 1/2015 | Kim | |
| 2015/0138473 A1 | 5/2015 | Zhang | |
| 2015/0348470 A1 | 12/2015 | Wang et al. | |
| 2015/0379916 A1 | 12/2015 | Guo et al. | |
| 2015/0380471 A1 | 12/2015 | Guo et al. | |
| 2016/0035305 A1 | 2/2016 | Jin et al. | |
| 2016/0217726 A1 | 7/2016 | Guo et al. | |
| 2016/0357070 A1 | 12/2016 | Yang et al. | |
| 2017/0110086 A1 | 4/2017 | Guo et al. | |

FOREIGN PATENT DOCUMENTS

| | | |
|---|---|---|
| CN | 1836188 A | 9/2006 |
| CN | 101424807 A | 5/2009 |
| CN | 101653012 A | 2/2010 |
| CN | 103777393 A | 5/2014 |
| CN | 104037201 A | 9/2014 |
| CN | 104050889 A | 9/2014 |
| CN | 104112763 A | 10/2014 |
| CN | 203931380 U | 11/2014 |
| CN | 104597675 A | 5/2015 |
| CN | 104614909 A | 5/2015 |
| CN | 104658433 A | 5/2015 |
| JP | 2014-026010 A | 2/2014 |
| TW | 200606769 A | 2/2006 |
| TW | I258721 B | 7/2006 |
| WO | 2012/176102 A1 | 12/2012 |

OTHER PUBLICATIONS

International Search Report of PCT/CN2015/090120 in Chinese, dated Feb. 15, 2016 with English translation.
Notice of Transmittal of the International Search Report of PCT/CN2015/090120 in Chinese, dated Feb. 15, 2016.
Written Opinion of the International Searching Authority of PCT/CN2015/090120 in Chinese, dated Feb. 15, 2016 with English translation.
International Search Report of PCT/CN2015/086865 in Chinese, dated Nov. 17, 2015 with English translation.
Notice of Transmittal of the International Search Report of PCT/CN2015/086865 in Chinese, dated Nov. 17, 2015.
Written Opinion of the International Searching Authority of PCT/CN2015/086865 in Chinese, dated Nov. 17, 2015 with English translation.
Chinese Office Action in Chinese Application No. 201510121608.4, dated Aug. 29, 2016 with English translation.
International Preliminary Report on Patentability of PCT/CN2015/086865, dated Sep. 19, 2017.
Extended European Search Report in EP 15837078.3 dated Aug. 7, 2018.
Notice of Allowance in U.S. Appl. No. 14/905,303 dated Apr. 5, 2017.

* cited by examiner

DISPLAY PANEL AND DISPLAY DEVICE

CROSS REFERENCE TO RELATED APPLICATIONS

This application is the National Stage of PCT/CN2015/090120 filed on Sep. 21, 2015, which claims priority under 35 U.S.C. § 119 of Chinese Application No. 201510065195.2 filed on Feb. 6, 2015, the disclosure of which is incorporated by reference.

TECHNICAL FIELD

Embodiments of the present disclosure relate to a display panel and a display device.

BACKGROUND

Currently, a widely-used pixel layout in a display panel is that red, green, blue (RGB) sub-pixels are sequentially arranged or red, green, blue, white (RGBW) sub-pixels are sequentially arranged.

As user's demand on resolution is increasingly high, the resolution of the display panel becomes higher and higher, in other words, the number of pixels in unit area is more and more, and thus it is required that the size of each sub-pixel becomes smaller and smaller. However, due to limitation of the technology, the size of the sub-pixel cannot be infinitely decreased. Thus, it is essential to modify the pixel layout.

SUMMARY

According to embodiments of the disclosure, a display panel. The display panel comprises a plurality of gate lines, a plurality of data lines and a plurality of sub-pixels formed by the plurality of gate lines and the plurality of data lines intersecting with each other, and the plurality of sub-pixels forming an array. In the array formed by the plurality of sub-pixels, a ratio of a width in a row direction to a height in a column direction of each sub-pixel is greater than 1:3, and a first row of sub-pixels and a second row of sub-pixels are alternately arranged in the column direction; each sub-pixel in the first row of sub-pixels and its adjacent sub-pixel in the second row of sub-pixels have different colors; each sub-pixel in the second row of sub-pixels and its adjacent sub-pixel in the first row of sub-pixels have different colors; and the sub-pixel in the second row of sub-pixels and the sub-pixel in the first row of sub-pixels which are provided in a same column are staggered by a distance of d in the row direction, where $0 \leq d < W/2$, and W is the width in the row direction of each sub-pixel.

For example, the ratio of the width in the row direction to the height in the column direction of each sub-pixel is 2:3, 1.5:3, or 3:3.

For example, each sub-pixel has a shape of parallelogram.

For example, each sub-pixel has a shape of rectangle or square.

For example, each sub-pixel is of a two-domain structure or a four-domain structure.

For example, an inclination direction of each sub-pixel in the first row of sub-pixels is opposite to that of each sub-pixel in the second row of sub-pixels.

For example, the plurality of gate lines are arranged in the row direction, the plurality of data lines are arranged in the column direction and incline along with the sub-pixels, and the sub-pixels connected with a same data line have a same color.

For example, the display panel is a liquid crystal display panel, and the display panel includes a plurality of pixel electrodes and a common electrode; the plurality of pixel electrodes are located in the plurality of sub-pixels respectively, and the common electrode is shared by the plurality of sub-pixels; and the pixel electrodes incline along with the sub-pixels.

For example, slit patterns are arranged in the common electrode, and the slit patterns incline along with the sub-pixels.

For example, the display panel is an organic electroluminescence display panel, and each sub-pixel includes a cathode, an anode and an organic light-emitting layer located between the cathode and the anode; and the cathode, the anode and the organic light-emitting layer incline along with the sub-pixel.

For example, in the first row of sub-pixels, a red sub-pixel, a green sub-pixel and a blue sub-pixel are sequentially arranged in the row direction; and in the second row of sub-pixels, the blue sub-pixel, the red sub-pixel and the green sub-pixel are sequentially arranged in the row direction.

For example, in the first row of sub-pixels, a red sub-pixel, a blue sub-pixel and a green sub-pixel are sequentially arranged in the row direction; and in the second row of sub-pixels, the green sub-pixel, the red sub-pixel and the blue sub-pixel are sequentially arranged in the row direction.

For example, in the first row of sub-pixels, a green sub-pixel, a blue sub-pixel and a red sub-pixel are sequentially arranged in the row direction; and in the second row of sub-pixels, the red sub-pixel, the green sub-pixel and the blue sub-pixel are sequentially arranged in the row direction.

For example, in the first row of sub-pixels, a green sub-pixel, a red sub-pixel and a blue sub-pixel are sequentially arranged in the row direction; and in the second row of sub-pixels, the blue sub-pixel, the green sub-pixel and the red sub-pixel are sequentially arranged in the row direction.

For example, in the first row of sub-pixels, a blue sub-pixel, a green sub-pixel and a red sub-pixel are sequentially arranged in the row direction; and in the second row of sub-pixels, the red sub-pixel, the blue sub-pixel and the green sub-pixel are sequentially arranged in the row direction.

For example, in the first row of sub-pixels, a blue sub-pixel, a red sub-pixel and a green sub-pixel are sequentially arranged in the row direction; and in the second row of sub-pixels, the green sub-pixel, the blue sub-pixel and the red sub-pixel are sequentially arranged in the row direction.

According to embodiments of the disclosure, a display device. The display device comprises the display panel as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise specified, the technical terms or scientific terms here should be of general meanings as understood by those ordinarily skilled in the art. In the specification and claims of the present disclosure of the patent application, words such as "first", "second" and the like do not denote any order, quantity, or importance, but rather are used for distinguishing different components. Similarly, "one" or "a/an" and other similar words mean at least one instead of quantitative limitation. Words such as "include" or "comprise" and the like denote that elements or objects appearing before the words of "include" or "comprise" cover the elements or the objects enumerated after the words of "include" or "comprise" or equivalents thereof, not exclusive of other elements or objects. "Connected" or "linked" or similar words are not limited to physical or mechanical connection, and may comprise electrical connection, either direct or indirect connection. Words such as "up", "down", "left", "right" and the like are only used for expressing relative positional relationship, when the absolute position of a described object is changed, the relative positional relationship may also be correspondingly changed.

Figure 9:
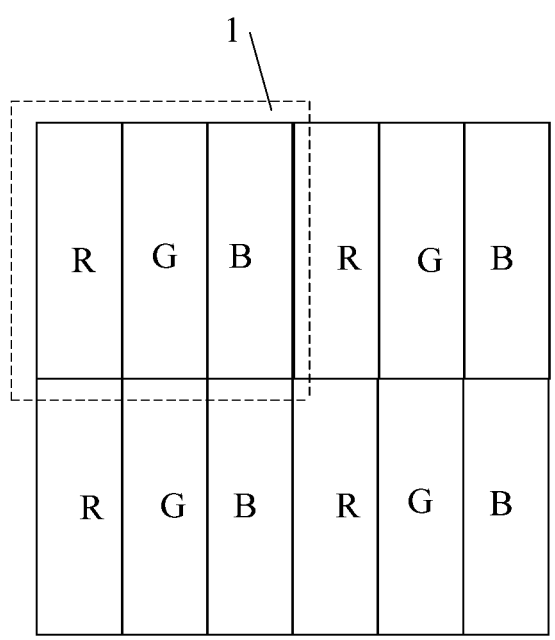
FIG. 9 is a schematic view of a sub-pixel layout of a display panel according to one technique.

FIG. 9 is a schematic view of a sub-pixel layout of a display panel according to one technique. The display panel comprises a display region and a non-display region. The display region includes a plurality of pixels 1. Each pixel 1 includes a red sub-pixel, a green sub-pixel and a blue sub-pixel which are sequentially arranged. Each pixel 1 is in a shape of square. Each of the red sub-pixel, green sub-pixel and blue sub-pixel is in a shape of rectangular strip, and a ratio of a width of each sub-pixel to a height each sub-pixel is 1:3. At the time of displaying, light mixing happens to content displayed by three sub-pixels in one pixel, so that a visible 'display point' is formed. Further, in the display panel shown in FIG. 9, in all rows, the red sub-pixel, the green sub-pixel and the blue sub-pixel are arranged in a same sequence.

Embodiments of the present disclosure provide a display panel. The display panel comprises a plurality of gate lines, a plurality of data lines and a plurality of sub-pixels formed by the plurality of gate lines and the plurality of data lines intersecting with each other, and the plurality of sub-pixels form an array. In the array formed by the plurality of sub-pixels, each sub-pixel for example is in a shape of parallelogram, a ratio of a width W in a row direction to a height H in a column direction of each sub-pixel is greater than 1:3, and a first row of sub-pixels and a second row of sub-pixels are alternately arranged in the column direction. Each sub-pixel in the first row of sub-pixels and its adjacent sub-pixel in the second row of sub-pixels have different colors. Each sub-pixel in the second row of sub-pixels and its adjacent sub-pixel in the first row of sub-pixels have different colors. The sub-pixel in the second row of sub-pixels and the sub-pixel in the first row of sub-pixels which are provided in a same column are staggered by a distance of d in the row direction, where $0 \leq d < W/2$, and W is the width in the row direction of each sub-pixel.

The display panel of the embodiments of the present disclosure adopts a pixel layout different from that of the display panel shown in FIG. 9. In the display panel according to the embodiments of the present disclosure, the ratio of the width W in the row direction to the height H in the column direction of each sub-pixel is greater than 1:3, the first row of sub-pixels and the second row of sub-pixels are alternately arranged in the column direction, each sub-pixel in the first row of sub-pixels and its adjacent sub-pixel in the second row of sub-pixels have different colors, each sub-pixel in the second row of sub-pixels and its adjacent sub-pixel in the first row of sub-pixels have different colors, and therefore, in the case that a display resolution is guaranteed, the number of the data lines are reduced and requirements on the production technology are lowered. Besides, in the display panel according to the embodiments of the present disclosure, the sub-pixel in the second row of sub-pixels and the sub-pixel in the first row of sub-pixels which are provided in a same column are staggered by a distance of d in the row direction, where $0 \leq d < W/2$, and therefore, the data lines are relatively smooth, resistance of the data lines is reduced, and voltage load on the display panel is reduced.

Next, the display panel according to the embodiments of the present disclosure will be described in detail with reference to the drawings.

Figure 1:
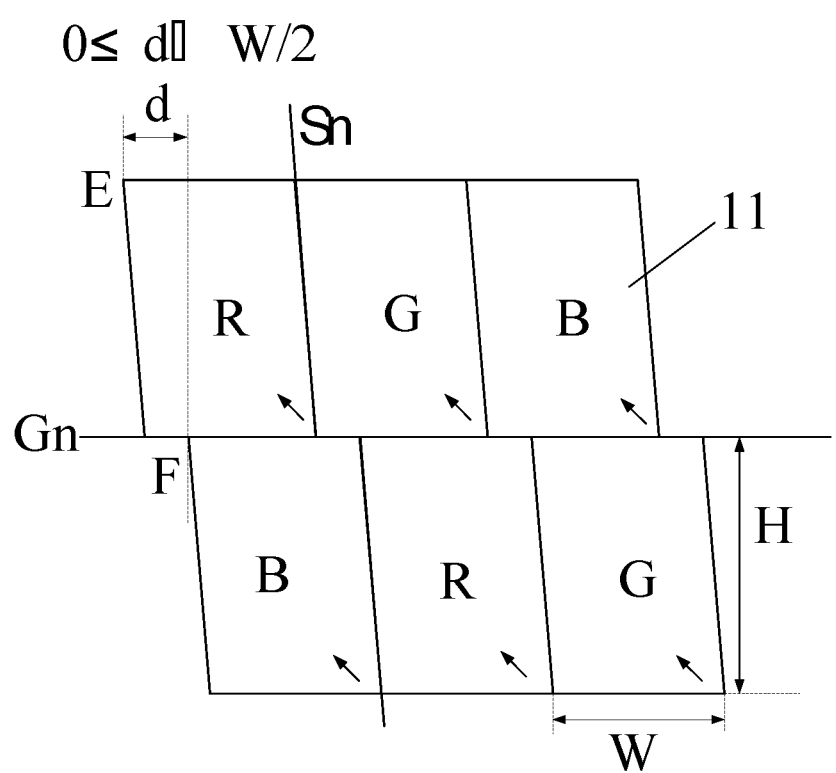
FIG. 1 is a schematic view 1 of a sub-pixel layout of a display panel according to embodiments of the present disclosure.

FIGS. 1 to 8 are schematic views of sub-pixel layouts of the display panel according to the embodiments of present disclosure. The display panel of the present disclosure includes the plurality of gate lines and the plurality of data lines. Each gate line extends in the row direction and is a straight line. Each data line extends in the column direction and is a zigzag line. As an example, FIG. 1 only shows the gate line Gn in an n-th row and the data line Sn in an n-th column. The plurality of gate lines and the plurality of data lines intersect with each other to form the plurality of sub-pixels 11 in the array form. Each sub-pixel 11 for example is in the shape of parallelogram. For example, as shown in FIG. 1, angles formed by sides of each sub-pixel in the column direction and the gate line are same. Each data line inclines along with the sub-pixels, for example, a portion of the data line, corresponding to the side of the sub-pixel 11 in the column direction, is parallel to the side of the sub-pixel in the column direction.

In the display panel according to the embodiments of the present disclosure, the ratio of the width W in the row direction to the height H in the column direction of each sub-pixel is greater than 1:3. For example, the ratio of the width W in the row direction to the height H in the column direction of each sub-pixel is W:H=2:3, 1.5:3, or 3:3 (namely 1:1). In the display panel shown in FIG. 9, the ratio of the width to the height of each sub-pixel is 1:3. However, in the display panel according to the embodiments of the present disclosure, the ratio of the width to the height of each sub-pixel is greater than 1:3. Thus, in the case that a size of display panel is kept constant, the width of the sub-pixel of the display panel according to the embodiments of the present disclosure is greater than the width of the sub-pixel of the display panel shown in FIG. 9; and thus, in the display panel according to the embodiments of the present disclosure, the number of the sub-pixels in the row direction is reduced, so that the number of the data lines is reduced, it is not necessary to manufacture each sub-pixel particularly small, and the requirements on the manufacturing technology is lowered.

On the other hand, in the case that the size of the display panel is kept constant, a physical resolution of the display panel of the embodiments of the present disclosure will decrease to a certain extent. In order to compensate such loss of the resolution, the sub-pixel layout of the display panel of the embodiments of the present disclosure is modified, that is, in the display panel according to the embodiments of the disclosure, the first row of sub-pixels and the second row of sub-pixels are alternately arranged in the column direction, each sub-pixel in the first row of sub-pixels and its adjacent sub-pixel in the second row of sub-pixels have different colors, each sub-pixel in the second row of sub-pixels and its adjacent sub-pixel in the first row of sub-pixels have different colors, and therefore, each sub-pixel in the first row of sub-pixels are shared by different pixels and each sub-pixel in the second row of sub-pixels are shared by different pixels, and the display resolution is guaranteed without being decreased even though the physical resolution of the display panel decreases.

Figure 7:
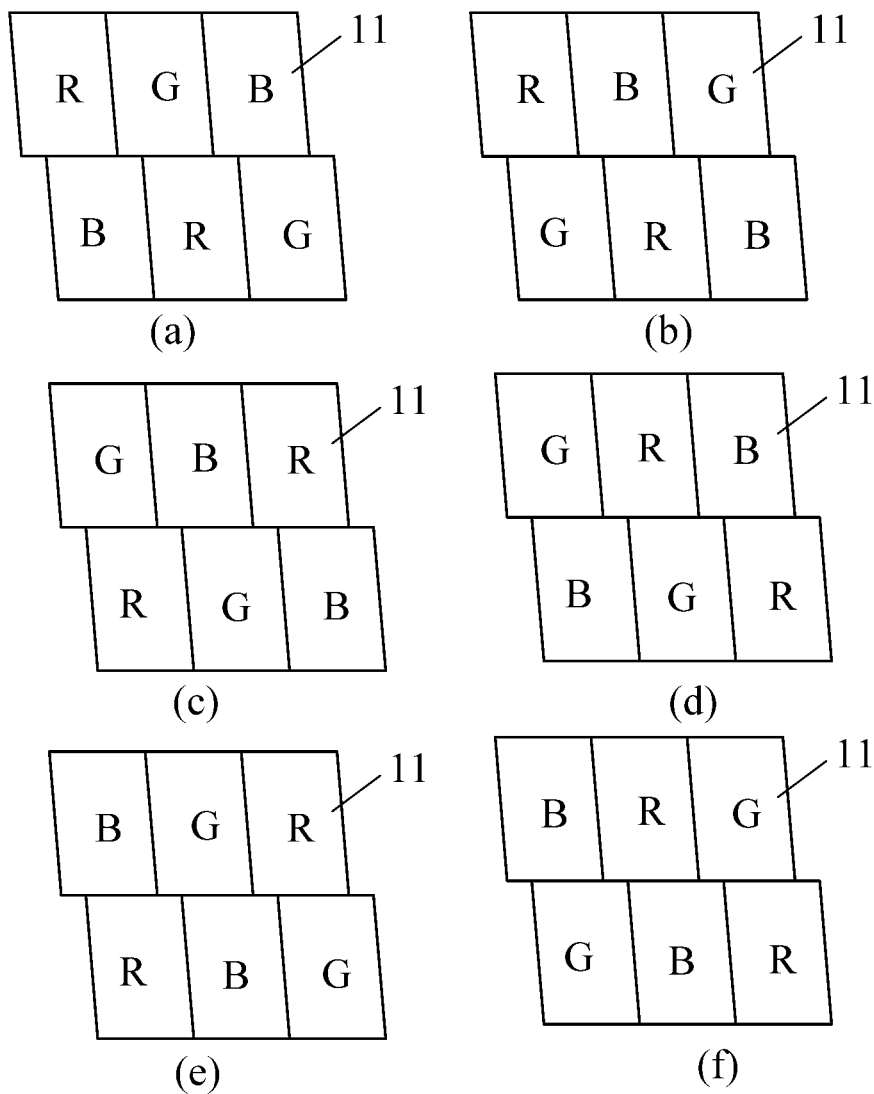
FIG. 7 is a schematic view 7 of the sub-pixel layout of the display panel according to the embodiments of the present disclosure.

For example, in the case that the display panel according to the embodiments of the present disclosure comprises three sub-pixels of a red sub-pixel, a blue sub-pixel and a green sub-pixel, the first row of sub-pixels and the second row of sub-pixels are arranged in six modes shown in FIG. 7.

(1) In the first row of sub-pixels, the red sub-pixel, the green sub-pixel and the blue sub-pixel are sequentially arranged in the row direction; and in the second row of sub-pixels, the blue sub-pixel, the red sub-pixel and the green sub-pixel are sequentially arranged in the column direction.

(2) In the first row of sub-pixels, the red sub-pixel, the blue sub-pixel and the green sub-pixel are sequentially arranged in the row direction; and in the second row of sub-pixels, the green sub-pixel, the red sub-pixel and the blue sub-pixel are sequentially arranged in the column direction.

(3) In the first row of sub-pixels, the green sub-pixel, the blue sub-pixel and the red sub-pixel are sequentially arranged in the row direction; and in the second row of sub-pixels, the red sub-pixel, the green sub-pixel and the blue sub-pixel are sequentially arranged in the column direction.

(4) In the first row of sub-pixels, the green sub-pixel, the red sub-pixel and the blue sub-pixel are sequentially arranged in the row direction; and in the second row of sub-pixels, the blue sub-pixel, the green sub-pixel and the red sub-pixel are sequentially arranged in the column direction.

(5) In the first row of sub-pixels, the blue sub-pixel, the green sub-pixel and the red sub-pixel are sequentially arranged in the row direction; and in the second row of sub-pixels, the red sub-pixel, the blue sub-pixel and the green sub-pixel are sequentially arranged in the column direction.

(6) In the first row of sub-pixels, the blue sub-pixel, the red sub-pixel and the green sub-pixel are sequentially arranged in the row direction; and in the second row of sub-pixels, the green sub-pixel, the blue sub-pixel and the red sub-pixel are sequentially arranged in the column direction.

By using the sub-pixel layout described above, the display resolution is guaranteed without being decreased even though the width of the sub-pixel becomes larger and the number of the sub-pixels becomes smaller. Therefore, the display panel according to the embodiments of the present disclosure lowers the requirements on the production technology in the case that the display solution is guaranteed.

Figure 2:
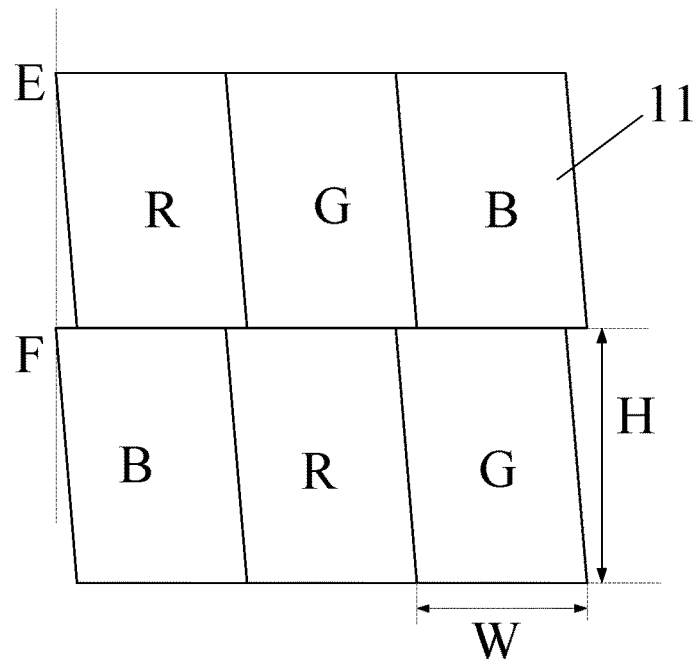
FIG. 2 is a schematic view 2 of the sub-pixel layout of the display panel according to the embodiments of the present disclosure.

Further, as shown in FIG. 1, in the display panel according to the embodiments of the present disclosure, the data lines are bent, resulting in an increase of resistance of the data lines. In order to reduce a bending degree of the data lines and reduce a degree by which the resistance of the data lines increases, in the display panel according to the embodiments of the present disclosure, the sub-pixel in the second row of sub-pixels and the sub-pixel in the first row of sub-pixels which are provided in the same column are staggered by the distance of d in the row direction, where $0 \leq d < W/2$, and W is the width in the row direction of each sub-pixel. As shown in FIG. 1, the staggered distance d is greater than 0 and less than W/2, which reduces the bending degree of the data lines, and reduces the degree by which the resistance of the data lines increases. As shown in FIG. 2, the staggered distance d is equal to 0, which further reduces the bending degree of the data lines, and further reduces the degree by which the resistance of the data lines increases. It should be noted that, the sub-pixel in the second row of sub-pixels and the sub-pixel in the first row of sub-pixels which are provided in the same column are staggered by the distance of d in the row direction, which refers to that any positions of the sub-pixel in the second row of sub-pixels and the sub-pixel in the first row of sub-pixels which are provided in the same column are staggered by the distance of d in the row direction d. In the drawings, as an example, it is shown that an upper left corner E of a first sub-pixel in the first row of sub-pixels and an upper left corner F of a first sub-pixel in the second row of sub-pixels are staggered by the distance of d.

Figure 3:
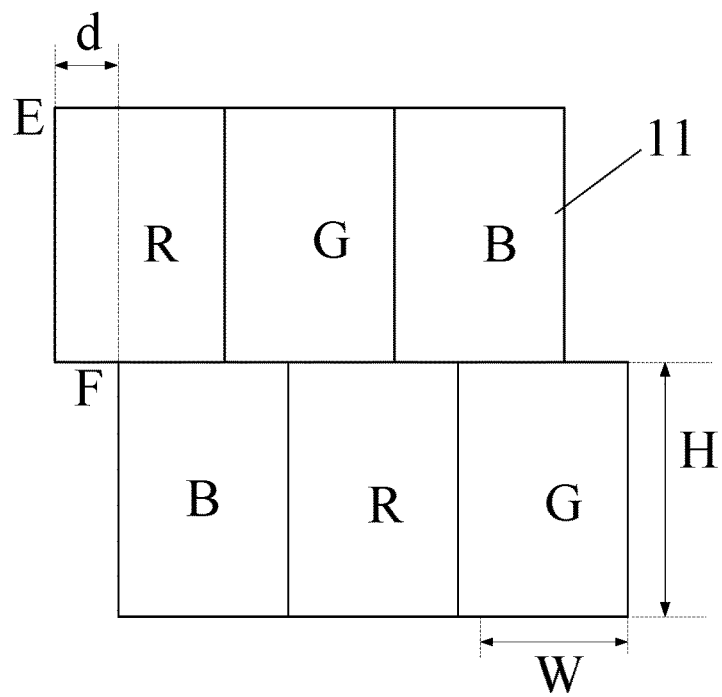
FIG. 3 is a schematic view 3 of the sub-pixel layout of the display panel according to the embodiments of the present disclosure.

Further, as shown in FIG. 3, in the display panel according to the embodiments of the present disclosure, each sub-pixel is of a shape of rectangle or square. Generally, sub-pixels of the liquid crystal display panel of a horizontal electric field mode (such as the liquid crystal display panel of an ADS mode, the liquid crystal display panel of an IPS mode and the like) have a shape of rectangle or square. Thus, in the case that the sub-pixels of the display panel according to the embodiments of the present disclosure have the shape of rectangle or square, the display panel is well applied to the liquid crystal display panel of the horizontal electric field mode, and therefore an application range of the display panel according to the embodiment of the present disclosure is widened.

Figure 4:
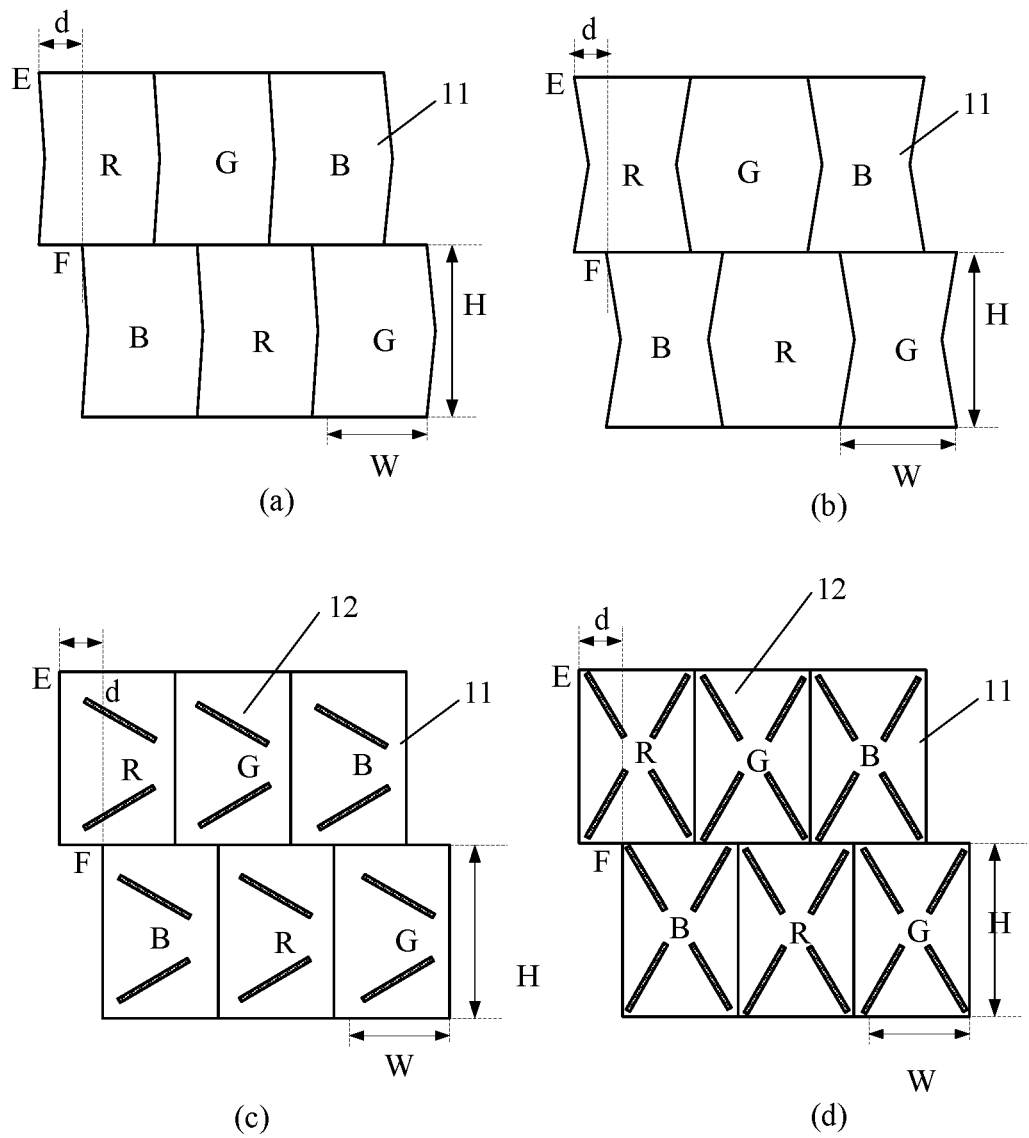
FIG. 4 is a schematic view 4 of the sub-pixel layout of the display panel according to the embodiments of the present disclosure.

Further, as shown in FIG. 4, in the display panel according to the embodiments of the present disclosure, each sub-pixel of the first row of sub-pixels and each sub-pixel of the second row of sub-pixels for example is of a multi-domain structure such as a two-domain structure or a four-domain structure, and therefore a viewing angle is widened and a color shift is decreased. The two-domain structure means that an electrode pattern (such as a slit pattern) in each sub-pixel has two different orientations, and the four-domain structure means that the electrode pattern (such as the slit pattern) in each sub-pixel has four different orientations. In the case that the multi-domain structure such as the two-domain structure or the four-domain structure is achieved, the sides of each sub-pixel in the column direction may be bent, (as shown in the FIG. 4(a) and the FIG. 4(b)), or the sides of each sub-pixel in the column direction may not be bent and be of a straight line (as shown in FIG. 4(c) and the FIG. 4(d)). In the case shown in FIG. 4(a), the electrode pattern (not shown) inclines along with the sides of the sub-pixel in the column direction to have two orientations so that the two-domain structure is achieved. In the case shown in FIG. 4(b), the electrode pattern (not shown) inclines along with the sides of the sub-pixel in the column direction to have four orientations so that the four-domain structure is achieved. In the case shown in FIG. 4(c), the sides of the sub-pixel in the column direction is of the straight line, and the electrode patterns 12 are set to have two different orientations so that the two-domain structure is achieved. In the case shown in FIG. 4(d), the sides of the sub-pixel in the column direction is of the straight line, and the electrode patterns 12 are set to have four different orientations so that the four-domain structure is achieved. It should be noted that, in FIG. 4(c) and FIG. 4(d), one electrode pattern 12 in each orientation is shown as an example; but actually, there exist a plurality of electrode patterns in each orientation.

In the display panel according to the embodiments of the present disclosure, an inclination direction of the first row of sub-pixels is same as that of the second row of sub-pixels, as shown in FIG. 1. In such case, angles formed by the sides of the first row of sub-pixels in the column direction and the gate line are same as angles formed by the sides of the second row of sub-pixels in the column direction and the gate line, for example, the angles are about 90-110 degrees.

Figure 5:
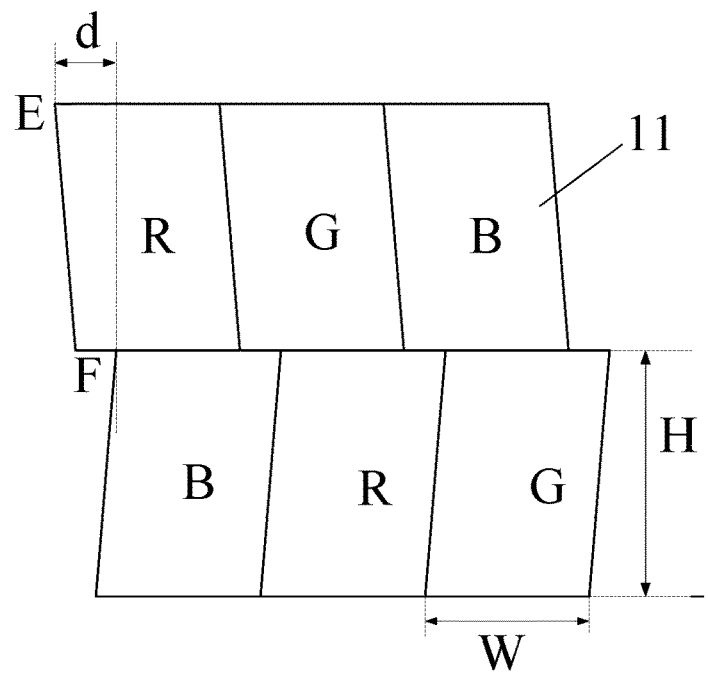
FIG. 5 is a schematic view 5 of the sub-pixel layout of the display panel according to the embodiments of the present disclosure.

Alternatively, in the display panel according to the embodiments of the present disclosure, the inclination direction of the first row of sub-pixels is opposite to that of the second row of sub-pixels, as shown in FIG. 5. In such case, the angles formed by the sides of the first row of sub-pixels in the column direction and the gate line are about 90-110 degrees, and the angles formed by the sides of the second row of sub-pixels in the column direction and the gate line are about 70-90 degrees. In the case that the inclination direction of the first row of sub-pixels is opposite to that of the second row of sub-pixels, each sub-pixel in the first row of sub-pixels and each sub-pixel in the second row of sub-pixels which are provided in the same column form a two-domain structure as a whole, and therefore the viewing angle is increased, and the color shift is decreased. It should be noted that, although the inclination direction of the first row of sub-pixels is opposite to that of the second row of sub-pixels in FIG. 5, the inclination degree of the first row of sub-pixels for example is same as that of the second row of sub-pixels; in other words, the inclination angle of the first row of sub-pixels in the anticlockwise direction with respect to a vertical direction, for example is equal to the inclination angle of the second row of sub-pixel in the clockwise direction with respect to the vertical direction.

Figure 6:
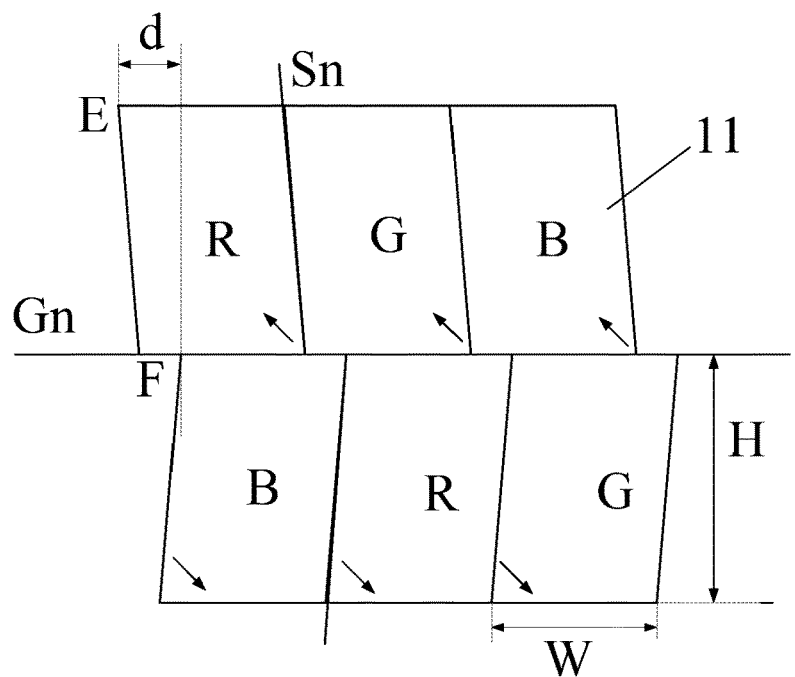
FIG. 6 is a schematic view 6 of the sub-pixel layout of the display panel according to the embodiments of the present disclosure.

In FIG. 1, an arrow in each sub-pixel represents a charging direction of the data line, and it can be seen that each data line charges sub-pixels located in the same column, that is, the sub-pixels connected with the same data line are located in the same column. In FIG. 6, the arrow in each sub-pixel also represents the charging direction of the data line, and it can be seen that each data line does not charge the sub-pixels located in the same column but charges sub-pixels of a same color, that is, the sub-pixels connected with the same data line have the same color. As shown in FIG. 6, in the case that the sub-pixels connected with the same data line have the same color, a point inverting effect is achieved through column inversion, and thus residual images are eliminated and power consumption is reduced in the case that a pure color image is displayed.

For example, the display panel according to the embodiments of the present disclosure is a liquid crystal display panel, an organic electroluminescence display panel and the like. In the case that the display panel according to the embodiments of the present disclosure is the liquid crystal display panel, the display panel includes a plurality of pixel electrodes and a common electrode; the plurality of pixel electrodes are located in the plurality of sub-pixels respectively; and the common electrode is shared by the plurality of sub-pixels. The pixel electrodes incline along with the sub-pixels. For example, the sides of the pixel electrodes in the column direction incline together with the sub-pixels; and further, the sides of the pixel electrodes in the column direction are parallel with the sides of the sub-pixels in the column direction. For example, slit patterns are arranged in the pixel electrodes, and in such case, the slit patterns for example incline along with the sub-pixels; and further, the slit patterns are parallel with the sides of the sub-pixels in the column direction. For example, slit patterns are arranged in the common electrode, and in such case, the slit patterns for example incline along with the sub-pixels; and further, the slit patterns are parallel with the sides of the sub-pixels in the column direction.

In the case that the display panel according to the embodiments of the present disclosure is the organic electroluminescence display panel. Each sub-pixel includes a cathode, an anode and an organic electroluminescence layer located between the cathode and the anode; and the cathode, the anode and the organic electroluminescence layer in the sub-pixel for example inclines along with the sub-pixel.

Figure 8:
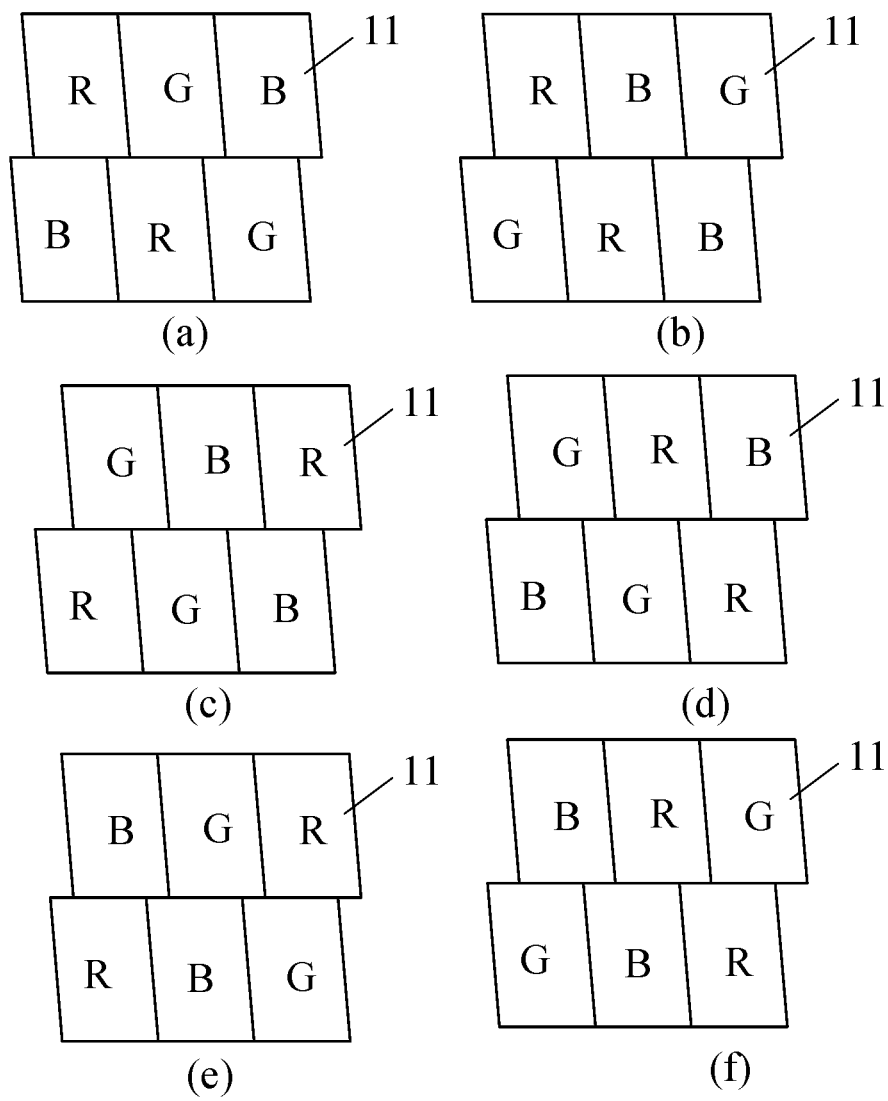
FIG. 8 is a schematic view 8 of the sub-pixel layout of the display panel according to the embodiments of the present disclosure.

It should be noted that, the sub-pixel in the second row of sub-pixels and the sub-pixel in the first row of sub-pixels which are provided in the same column are staggered by the distance of d in the row direction, which refers to that: the sub-pixel in the second row of sub-pixels and the sub-pixel in the first row of sub-pixels which are provided in the same column are staggered by the distance of d in a positive direction of the row direction, as shown in FIG. 1 to 7; or the sub-pixel in the second row of sub-pixels and the sub-pixel in the first row of sub-pixels which are provided in the same column are staggered by the distance of d in a negative direction of the row direction, as shown in FIG. 8.

It should be noted that, the sub-pixel layouts of the display panel according to the embodiments of the present disclosure shown in FIGS. 1 to 8 may be combined with each other without conflict.

According to the embodiments of the present disclosure, there is further provided a display device. The display device comprises any display panel as described above. For example, the display device is a liquid crystal display, electronic paper, an organic electroluminescence display, a mobile phone, a tablet personal computer, a TV set, a display, a notebook computer, a digital photo frame, a navigation instrument, a watch, or any other product or component with a display function.

The foregoing embodiments merely are exemplary embodiments of the disclosure, and not intended to define the scope of the disclosure, and the scope of the disclosure is determined by the appended claims.

The present application claims priority of Chinese Patent Application No. 201510065195.2 filed on Feb. 6, 2015, the present disclosure of which is incorporated herein by reference in its entirety as part of the present application.

The invention claimed is:

1. A display panel, comprising a plurality of gate lines, a plurality of data lines and a plurality of sub-pixels formed by the plurality of gate lines and the plurality of data lines intersecting with each other, and the plurality of sub-pixels forming an array, wherein, in the array formed by the plurality of sub-pixels, a ratio of a width in a row direction to a height in a column direction of each sub-pixel is greater than 1:3, and a first row of sub-pixels and a second row of sub-pixels are alternately arranged in the column direction;

each sub-pixel in the first row of sub-pixels and its adjacent sub-pixel in the second row of sub-pixels have different colors;

each sub-pixel in the second row of sub-pixels and its adjacent sub-pixel in the first row of sub-pixels have different colors;

the sub-pixel in the second row of sub-pixels and the sub-pixel in the first row of sub-pixels which are provided in a same column are staggered by a distance of d in the row direction, where $0 \leq d < W/2$, and W is the width in the row direction of each sub-pixel;

the sub-pixels in the first row and the sub-pixels in the second row have a same inclination direction;

each sub-pixel in the first row of sub-pixels comprises a first row side and a second row side which extend along the gate lines, the second row side is adjacent to the second row of sub-pixels, and each sub-pixel in the second row of sub-pixels comprises a third row side which extends along the gate lines and is adjacent to the first row of sub-pixels; and for two adjacent sub-pixels which are in a same column and in different rows, a distance that the second row side of a first sub-pixel in the first row of sub-pixels and the third row side of a second sub-pixel in the second row of sub-pixels are staggered by is smaller than a distance that the first row side of the first sub-pixel and the third row side of the second sub-pixel are staggered by.

2. The display panel according to claim 1, wherein, the ratio of the width in the row direction to the height in the column direction of each sub-pixel is 2:3, 1.5:3, or 3:3.

3. The display panel according to claim 1, wherein, each sub-pixel has a shape of parallelogram.

4. The display panel according to claim 3, wherein, each sub-pixel has a shape of rectangle or square.

5. The display panel according to claim 1, wherein, each sub-pixel is of a two-domain structure or a four-domain structure.

6. The display panel according to claim 1, wherein, an inclination direction of each sub-pixel in the first row of sub-pixels is opposite to that of each sub-pixel in the second row of sub-pixels.

7. The display panel according to claim 1, wherein, the plurality of gate lines are arranged in the row direction, the plurality of data lines are arranged in the column direction and incline along with the sub-pixels, and the sub-pixels connected with a same data line have a same color.

8. The display panel according to claim 1, wherein,
the display panel is a liquid crystal display panel, and the display panel includes a plurality of pixel electrodes and a common electrode;
the plurality of pixel electrodes are located in the plurality of sub-pixels respectively, and the common electrode is shared by the plurality of sub-pixels; and
the pixel electrodes incline along with the sub-pixels.

9. The display panel according to claim 8, wherein, slit patterns are arranged in the common electrode, and the slit patterns incline along with the sub-pixels.

10. The display panel according to claim 1, wherein,
the display panel is an organic electroluminescence display panel, and each sub-pixel includes a cathode, an anode and an organic light-emitting layer located between the cathode and the anode; and
the cathode, the anode and the organic light-emitting layer incline along with the sub-pixel.

11. The display panel according to claim 1, wherein,
in the first row of sub-pixels, a red sub-pixel, a green sub-pixel and a blue sub-pixel are sequentially arranged in the row direction; and
in the second row of sub-pixels, the blue sub-pixel, the red sub-pixel and the green sub-pixel are sequentially arranged in the row direction.

12. The display panel according to claim 1, wherein,
in the first row of sub-pixels, a red sub-pixel, a blue sub-pixel and a green sub-pixel are sequentially arranged in the row direction; and
in the second row of sub-pixels, the green sub-pixel, the red sub-pixel and the blue sub-pixel are sequentially arranged in the row direction.

13. The display panel according to claim 1, wherein,
in the first row of sub-pixels, a green sub-pixel, a blue sub-pixel and a red sub-pixel are sequentially arranged in the row direction; and
in the second row of sub-pixels, the red sub-pixel, the green sub-pixel and the blue sub-pixel are sequentially arranged in the row direction.

14. The display panel according to claim 1, wherein,
in the first row of sub-pixels, a green sub-pixel, a red sub-pixel and a blue sub-pixel are sequentially arranged in the row direction; and
in the second row of sub-pixels, the blue sub-pixel, the green sub-pixel and the red sub-pixel are sequentially arranged in the row direction.

15. The display panel according to claim 1, wherein,
in the first row of sub-pixels, a blue sub-pixel, a green sub-pixel and a red sub-pixel are sequentially arranged in the row direction; and
in the second row of sub-pixels, the red sub-pixel, the blue sub-pixel and the green sub-pixel are sequentially arranged in the row direction.

16. The display panel according to claim 1, wherein,
in the first row of sub-pixels, a blue sub-pixel, a red sub-pixel and a green sub-pixel are sequentially arranged in the row direction; and
in the second row of sub-pixels, the green sub-pixel, the blue sub-pixel and the red sub-pixel are sequentially arranged in the row direction.

17. A display device, comprising the display panel according to claim 1.

* * * * *